United States Patent [19]

Brilliott

[11] Patent Number: 5,334,030

[45] Date of Patent: Aug. 2, 1994

[54] PCMCIA BUS EXTENDER CARD FOR PCMCIA SYSTEM DEVELOPMENT

[75] Inventor: Al W. Brilliott, Los Altos Hills, Calif.

[73] Assignee: National Semiconductor Corporation, Santa Clara, Calif.

[21] Appl. No.: 98,745

[22] Filed: Jul. 28, 1993

Related U.S. Application Data

[63] Continuation of Ser. No. 892,544, Jun. 1, 1992, abandoned.

[51] Int. Cl.$^5$ .............................................. H05K 1/14
[52] U.S. Cl. .................................... 439/75; 324/755; 439/912
[58] Field of Search ............ 439/59, 60, 61, 912, 439/74, 75; 324/158 P, 158 F; 361/412, 413

[56] References Cited

U.S. PATENT DOCUMENTS

| | | | |
|---|---|---|---|
| 2,951,185 | 8/1960 | Buck | 361/412 |
| 3,808,532 | 4/1974 | Yuska | 439/61 |
| 4,561,711 | 12/1985 | Zrnich | 439/59 |
| 4,819,131 | 4/1989 | Watari | 361/414 |
| 4,935,284 | 6/1990 | Puerner | 361/397 |
| 4,980,856 | 12/1990 | Ueno | 361/393 |
| 5,010,446 | 4/1991 | Scannell | 361/413 |
| 5,051,099 | 9/1991 | Pickles et al. | 439/108 |
| 5,184,282 | 2/1993 | Kaneda et al. | 439/61 |

FOREIGN PATENT DOCUMENTS

1570165  6/1980  United Kingdom ................ 439/108

Primary Examiner—Neil Abrams

[57] ABSTRACT

An extender card for extending a PCMCIA bus, to permit development of a PCMCIA board on a host notebook computer which also may be the intended target notebook computer on which the PCMCIA board will be used. The extender card includes a PCMCIA header, a PCMCIA receptacle, and a plurality of wirewrap pins, all coupled by a plurality of conductors. A ground plane and a plurality of ground conductors provide noise immunity. A power plane provides good conductivity for VCC. The extender card is sized and shaped to be inserted into the notebook computer through a conventional access opening into a PCMCIA receptacle within the notebook computer, and to extend out that opening to permit easy access. A PCMCIA board under development may be coupled to the extended PCMCIA bus lines via the extender card's wirewrap pins or its PCMCIA receptacle.

23 Claims, 3 Drawing Sheets

PCMCIA BUS EXTENDER CARD FOR PCMCIA SYSTEM DEVELOPMENT

CROSS REFERENCE TO RELATED APPLICATIONS

This is a continuation of copending application Ser. No. 07/892,544, filed on Jun. 1, 1992, now abandoned.

BACKGROUND OF THE INVENTION

1. Field of the Invention

This invention relates generally to computer board/circuit development boards, and more specifically to a PCMCIA bus-compatible extender card adapted to permit the development of PCMCIA boards on the target notebook, laptop, palmtop, pen-based, or similar computing system.

2. Description of Related Art

Bus extender cards are generally well known in the board/circuit development art. An extender card generally does not provide any processing or programming capability, and serves simply to provide a more convenient access to a host computer's bus than is otherwise available.

Recent advances in notebook computers have precipitated the development of the Personal Computer Memory Card International Association (PCMCIA) bus standard. Recently, developers have realized that the PCMCIA bus can advantageously be used to connect a wide variety of peripheral devices, and not merely memory cards, to computers.

Due to the typically large size of prototype boards as compared to their subsequent and corresponding final design boards, it is difficult to develop prototype boards within the confines of a computer. The necessarily cramped space within a notebook computer makes it even more difficult to do notebook computer board development.

FIG. 1 illustrates the present state of the art in PCMCIA board development. A full-sized personal computer (PC) 10 is used, rather than a notebook computer. The PC provides a much larger internal board space 12 within which to work. The PC is provided with one or more bus slots 14, which provide access to the PC's AT bus. Conventional PCs do not have a PCMCIA bus, however, and are used only as a cross-development platform for PCMCIA cards intended for ultimate use on another host platform such as a notebook computer having a PCMCIA bus.

In order to perform development of PCMCIA bus-compatible boards 16, therefore, the present state of the art provides an AT bus card 18 which has an interface for connection to the AT bus and one or more interfaces for connection to the PCMCIA board. As illustrated, the PCMCIA board may be directly coupled to the AT card, in which case the top cover of the PC must be removed, as the PCMCIA board will extend too far in the vertical plane. As also illustrated, the PCMCIA board may optionally be coupled to the AT card via a ribbon cable 20 or other suitable means, in which case an opening must be provided through the PC case, to allow extension of the cable. Optionally, the AT card may provide a PCMCIA port 22 on the conventional rear panel at which access if generally had to slot cards, and the ribbon cable 20 may be coupled to this port 22.

It is believed that such AT cards are currently available from Intel Corporation. It will be understood that this prior system has at least two significant disadvantages which render it less than suitable for notebook computer PCMCIA card development. First, the AT card cannot be used in conjunction with the notebook computer itself. Thus, the developer cannot be certain during development that the PCMCIA card will actually work in a notebook computer, as the development platform (PC) and the target platform (notebook) may have unpredictably different bus, timing, loading, and other characteristics, even among so-called "compatible" components and protocols. Second, the AT card does not provide any readily-accessible means for "wirewrapping" components to form the desired circuitry. Board development generally is performed using at least some degree of wirewrapping, which provide for easy reworking of circuit configuration, in case the designer has made an error or oversight in the circuit layout.

Thus, it is seen that it is highly desirable to have a PCMCIA extender card which solves the problems detailed above. The PCMCIA extender card should provide direct access to a notebook computer such that the target platform notebook computer can be directly utilized as the development platform, to ensure board compatibility and to eliminate the unnecessary expense otherwise required in purchasing a PC development platform. Further, the PCMCIA extender card should provide wirewrap access to all pinouts of the PCMCIA bus, to enable the developer to readily reconfigure the circuit under design, and to provide convenient test probe access to the bus.

SUMMARY OF THE INVENTION

The purpose of the present invention, therefore, is to solve these problems. The present invention includes a generally elongated member, a PCMCIA header coupled to a first end of the elongated member, a PCMCIA receptacle coupled to a second end of the elongated member, and a plurality of conductors electrically coupling the PCMCIA header to the PCMCIA receptacle. The invention further includes a plurality of wirewrap pins coupled to the elongated member and electrically coupled to respective ones of the plurality of conductors. A first end of the elongated member has a width (A) sufficiently narrow to permit its insertion through an opening in a notebook computer. The conductors may be formed as traces. A ground plane and a power plane extend substantially along a length of the plurality of conductors. A plurality of ground strips extends substantially in parallel with the plurality of conductors. The ground strips and one or more of the conductors may be coupled to the ground plane.

To use the extender card, it is inserted into the PCMCIA receptacle in a notebook computer. A development board is then electrically coupled to the extender card, either by wirewrapping or by insertion into the extender card's PCMCIA receptacle. The development board may further be mechanically attached to a portion of the extender card which extends out from the notebook computer.

DESCRIPTION OF THE PREFERRED EMBODIMENTS

The following description will be presented with reference to use of the extender card in a notebook computer. However, any suitable computing platform may be utilized as either the host development system or the ultimate target system for the product developed on the extender card.

Figure 1:
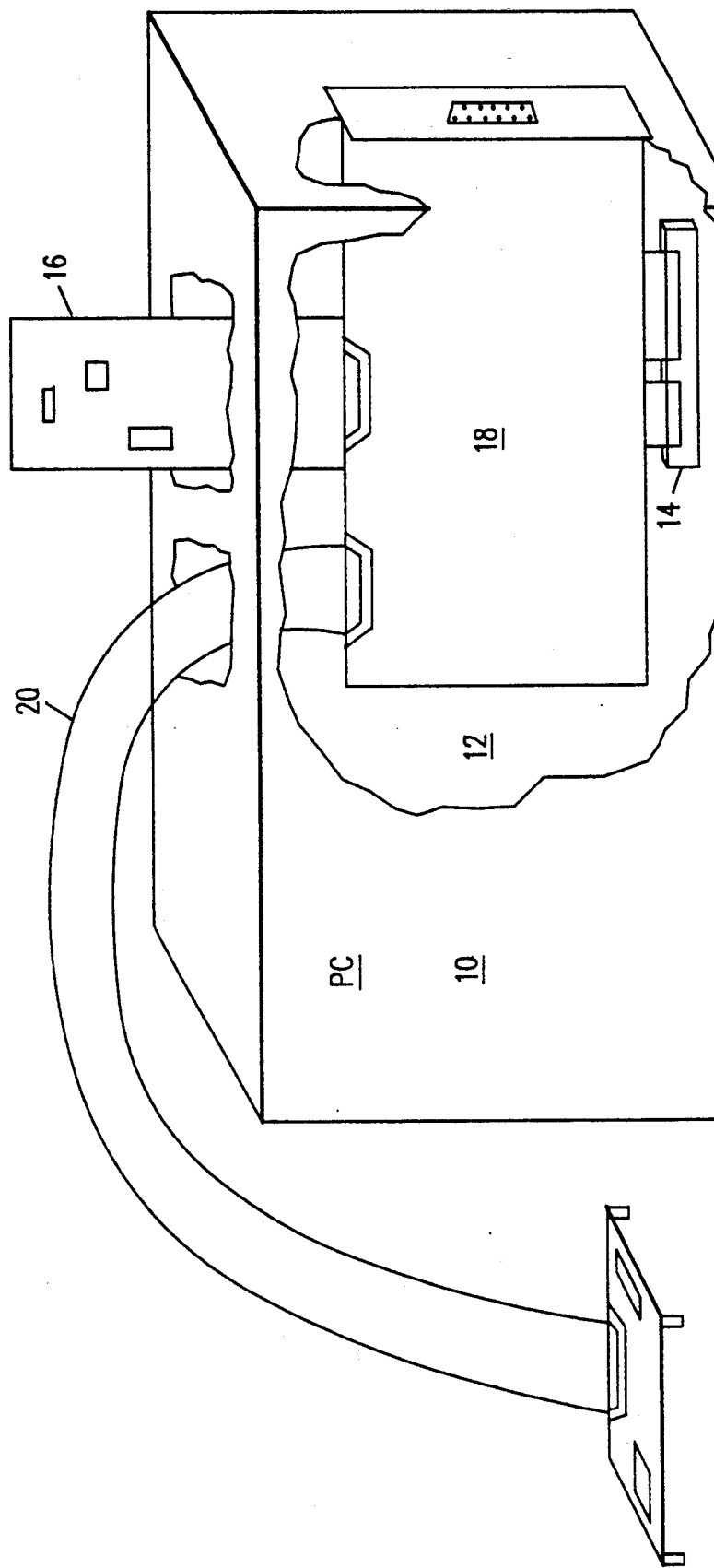
FIG. 1 illustrates prior art, showing a previous system of developing a PCMCIA card through an AT card in a PC.
Figure 2:
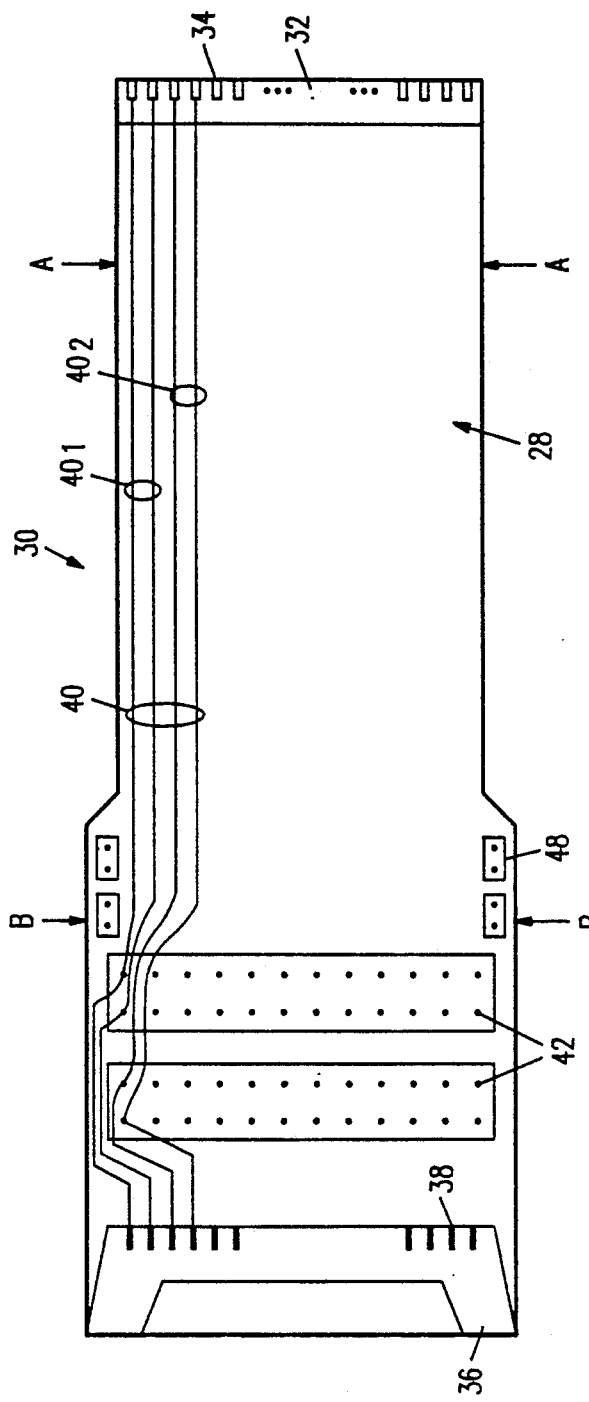
FIG. 2 is a top view of the PCMCIA extender card of the present invention.

FIG. 2—General Features of the Extender Card

FIG. 2 illustrates the PCMCIA extender card 30 of the present invention. The PCMCIA extender card 30 (hereinafter "the extender") includes a generally elongated member 28, which may be constructed of any suitable material which is both rigid and insulating. In one mode, the elongated member may be constructed of epoxy glass.

At one end, the extender 30 includes a PCMCIA header 32, which includes a plurality of female connectors 34. At the other end, the extender 30 includes a PCMCIA receptacle 36, which includes a plurality of male connectors 38. According to the PCMCIA bus standard, the PCMCIA bus includes sixty-eight lines, and the header and receptacle each includes two rows of connectors, thirty-four connectors per row.

Extending along the extender 30, a plurality of lines 40 connect corresponding female and male connectors of the PCMCIA header and receptacle, respectively. In one mode, the lines 40 are formed as traces.

In one mode, the traces are formed on the two sides of the extender 30. This permits the use of traces twice as wide as would be feasible were only one side utilized. Thus, each side of the extender 30 will carry thirty-four traces.

The header end of the extender is adapted for insertion into a notebook computer, while the receptacle end is adapted for connection to a board-under-development (not shown). Thus, a portion of the header end of the extender must be sufficiently narrow (as indicated by width arrows A) to permit the extender's insertion into a notebook computer. As the receptacle end of the extender need not fit into the notebook computer, it may be of any desired width. In particular, it may be wider (as indicated by width arrows B), to accommodate the PCMCIA receptacle, which is necessarily wider than the PCMCIA header (which fits within a PCMCIA receptacle).

The extender may additionally include a plurality of wirewrap pins 42. These may advantageously be affixed to the wider receptacle end of the extender. As is seen in FIG. 2, the traces 40 need not extend strictly linearly from end to end, but may be formed in any suitable layout to provide access to the wirewrap pins 42. Thus, the wirewrap pins 42 are coupled to corresponding traces 40, to provide electrical access to the individual lines of the PCMCIA bus.

As is shown, the wirewrap pins 42 may be configured in any suitable layout, and need not be strictly side-by-side. In particular, the wirewrap pins 42 may be laid out on 0.1" centers, as in a conventional breadboard, and may be arranged in two sets. In one mode, the wirewrap pins in a first set $42_1$ are coupled to the traces $40_1$ on a first side of the extender 30, while the wirewrap pins in a second set $42_2$ are coupled to the traces $40_2$ on a second side of the extender 30. This permits easy routing of the traces 40 about the wirewrap pins 42.

Figure 3:
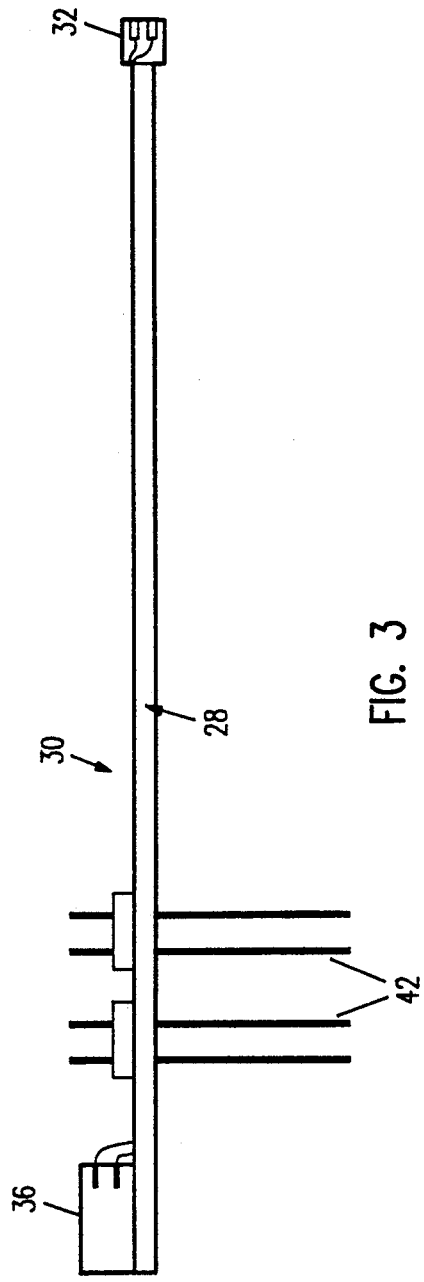
FIG. 3 is a side view of the PCMCIA extender card.

FIG. 3—Side View of the Extender Card

FIG. 3 shows the extender 30 in side view, illustrating in particular the wirewrap pins 42, which were shown end-on in FIG. 2. The traces are not visible in FIG. 3, but it is illustrated that the PCMCIA header 32 and receptacle 36 are connected thereto.

Figure 4:
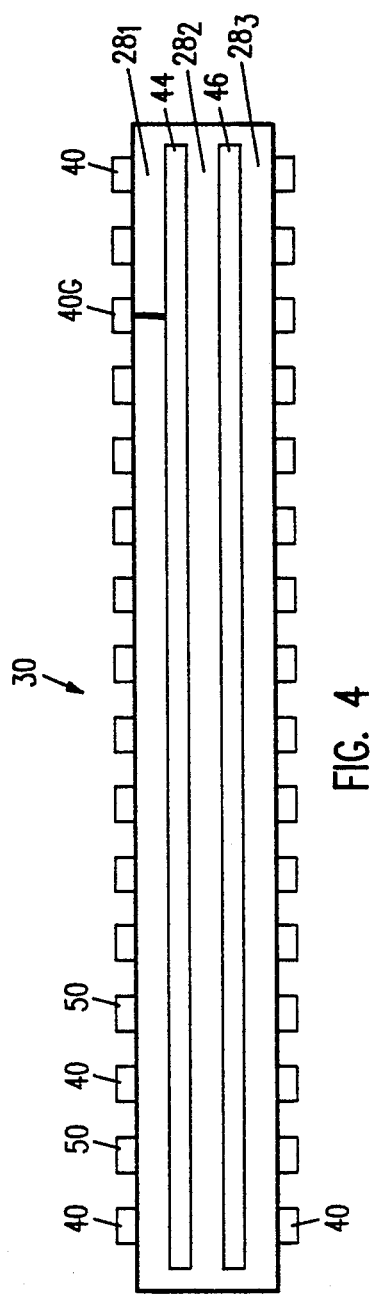
FIG. 4 is a cross-sectional view of the PCMCIA extender card, showing an optional ground plane, and showing ground traces alternately interspersed with the bus traces.

FIG. 4—Ground Plane and Power Plane

FIG. 4 illustrates an enhanced mode of the extender 30, in which a conductive ground plane 44 is provided. The ground plane 44 provides various shielding and noise-reducing characteristics known to be advantageous in cabling and bussing systems.

FIG. 4 illustrates a still further embodiment in which a conductive power plane 46 is provided. The power plane 46 provides low resistance conduction of VCC or other power supply voltage through the extender 30.

The ground plane 44 and the power plane 46 may be formed of copper, as may the conductive traces 40. The ground plane 44 and the power plane 46 may advantageously be formed as metal layers sandwiched between layers of the non-conductive material of the elongated member 28. The elongated member 28 thus includes first, second, and third layers $28_1$, $28_2$, and $28_3$ of insulating material.

In one mode, the ground plane 44 and the power plane 46 do not extend to the outer extremities of the extender 30; rather, the insulating material of the elongated member 28 completely encases the ground plane 44 and the power plane 46, to prevent any accidental short circuit which might otherwise occur should the edge of the extender 30 come into contact with a conductive item.

The ground plane 44 and the power plane 46 are formed having conventional vias (holes) (not shown) through which the wirewrap pins pass, such that the wirewrap pins are not in electrical contact with the ground plane 44 or the power plane 46.

FIG. 2—Bypass Capacitors

FIG. 2 illustrates that the extender 30 includes connections 48 into which bypass capacitors (not shown) may optionally be inserted. The bypass capacitor connections are each coupled between the ground plane and the power plane, for performing conventional AC bypass. Typically, the bypass capacitors may be in the range from 0.1 to 1.0 microFarads, but any suitable value may be used, depending on the load of the development board. In one mode, the extender 30 includes four connections 48, permitting the parallel coupling of various sizes of bypass capacitors.

FIG. 4—Ground Traces

FIG. 4 further illustrates another enhanced mode of the extender 30, in which a plurality of ground traces 50 are provided. The ground traces are alternately interspersed with the connective traces 40. Any suitable number of ground traces may be utilized. In one mode, for N PCMCIA bus lines extended by N conductive traces 40, $N-1$ ground traces 50 are present, and are alternately interspersed with the traces 40.

The ground traces 50 may be coupled to the ground plane 44 at any suitable location (s) along the extender 30. This may be accomplished by any conventional means, such as by soldering through vias (not shown) in the extender card 30.

Typically, at least one of the PCMCIA bus lines will be used to carry a ground reference potential. In one mode, the extender card conductor (s) $40_G$ which carry ground are also coupled to the ground plane. The optional ground traces 46 are in addition to, not in lieu of, the conventional ground conductor traces $40_G$.

The ground traces $40_G$ need not necessarily extend along the entire length of the connective traces 40, but may be sized according to a variety of requirements, including available pitch, extender width requirements, noise characteristics, and the like.

Figure 5:
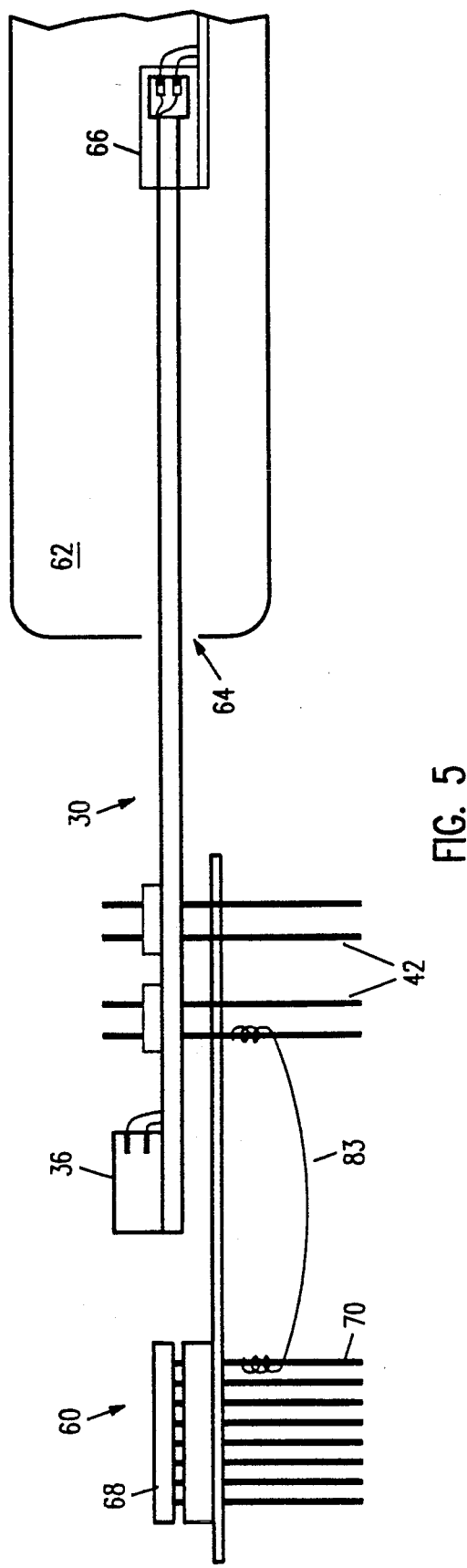
FIG. 5 is a side view illustrating the PCMCIA extender card as utilized in developing a PCMCIA board on a notebook computer host platform.

FIG. 5—Use of the Extender Card

FIG. 5 shows the extender 30 being utilized in a notebook computer 50 for the development of a PCMCIA board 60. The extender 30 is inserted header-first into the notebook computer 62 through a conventional access slot or opening 64, generally located in the back of the notebook computer 62. The header is operatively coupled to a PCMCIA receptacle 66 of the notebook computer 62.

The PCMCIA board 60 under development may be a breakboard or the like, and includes components 68 which are connected together on the development board to form the circuit under design. In the interest of simplicity, only one such component is shown, for illustrative purposes.

The circuit under design will have two types of electrical connections. Internal electrical connections (i.e. those strictly between components 68) are not shown, in the interest of simplicity. External electrical connections (i.e., those to the outside world via the PCMCIA bus) may be made by wiring wirewrap pins 70 on the development board 60 to the wirewrap pins 42 on the extender 30, as shown by wire 83.

The development board 60 may be mechanically coupled to the extender 30 in any of three ways. The first way, that shown in FIG. 5, involves the wirewrap pins 42. The development board 60 has a plurality of conventional breadboard holes (not shown) through which the extender's wirewrap pins 42 may be extended. The development board may then be held in place by any conventional means. For example, conventional standoff supports (not shown) may be used for support and to provide an insulating distance between the extender 30 and the development board 60.

The second way (not shown) may be used when the development board has a PCMCIA header (not shown). Accordingly, the development board's header may simply be inserted into the extender's receptacle 36.

According to the third way (also not shown), the development board and the extender are not mechanically coupled, but are electrically coupled via a ribbon cable or the like.

Conclusion

It will be readily appreciated by those skilled in the art that the principles of the present invention may be adapted for use with bus standards other than the PCMCIA standard and with development platforms other than notebook computers.

The present invention has been described with reference to specific preferred embodiments and to specific illustrative drawings, for ease of explanation. Various alterations in form and configuration details may readily be made, within the scope of this invention. Nevertheless, the invention is to be defined according to the following Claims.

I claim:

1. An extender card suitable for use with a personal computing system having a casing and a PCMCIA port disposed within the casing, the PCMCIA port being accessible through an opening in the casing and being spaced apart from the opening sufficiently to be capable of receiving a PCMCIA logic board therebetween, the extender card providing a development environment for peripheral devices to be connected to a PCMCIA port, the extender card comprising:

a generally elongated member;

a PCMCIA header coupled to a first end of the elongated member for engaging the PCMCIA port of the personal computing system, the PCMCIA header and the first end of the elongated member being sized to fit through the casing opening associated with the PCMCIA; port of the personal computing system;

a PCMCIA receptacle coupled to a second end of the elongated member;

a plurality of conductors electrically coupled to the PCMCIA header; and a plurality of elongated narrow pins arranged in an array, each pin being connected to an associated one of the conductors and extending transversly from the plane of the elongated member, each pin also configured to serve as a connector for external electrical components, wherein the elongated member is sufficiently long so that when the extender card is plugged into the PCMCIA port, the pins will be positioned outside of the casing for connection to external electrical conductors.

2. The extender card of claim 1, for use with a notebook computer having a conventional PCMCIA port accessible through an opening in the notebook computer, and wherein:

the first end of the elongated member has a width sufficiently narrow to permit its insertion through the opening.

3. The extender card of claim 1 wherein the conductors comprise:

traces formed on the elongated member.

4. The extender card of claim 1 further comprising: a ground plane coupled to the elongated member.

5. The extender card of claim 1 further comprising: a power plane coupled to the elongated member.

6. The extender card of claim 4 wherein:

the ground plane extends substantially along a length of the plurality of conductors.

7. The extender card of claim 4 wherein:

the plurality of conductors includes at least one ground conductor coupled to the ground plane.

8. The extender card of claim 1 further comprising:

a plurality of ground strips extending substantially in parallel with the plurality of conductors.

9. The extender card of claim 8 wherein:

the plurality of conductors includes N conductors;

the plurality of ground strips includes at least $N-1$ ground strips; and the ground strips are alternately interspersed with the conductors.

10. The extender card of claim 9 further comprising:

a ground plane coupled to the elongated member and extending substantially along the plurality of conductors and the plurality of ground strips.

11. The extender card of claim 10 wherein:
the plurality of conductors includes at least one ground conductor coupled to the ground plane; and
at least one of the ground strips is coupled to the ground plane.

12. An extender card suitable for use with a personal computing system having a casing and a PCMCIA port disposed within the casing, the PCMCIA port being accessible through an opening in the casing and being spaced apart from the opening sufficiently to be capable of receiving a PCMCIA logic board therebetween, the extender card comprising:
a generally elongated member;
a PCMCIA header coupled to a first end of the elongated member for engaging the PCMCIA port of the personal computing system, the PCMCIA header and the first end of the elongated member being sized to fit through the casing opening associated with the PCMCIA port of the personal computing system, the PCMCIA header including a plurality of connectors;
a plurality of conductors electrically coupled to respective ones of the connectors;
a plurality of wirewrap pins coupled to the elongated member and electrically coupled to respective ones of the plurality of conductors; and
wherein the elongated member is sufficiently long so that when the extender card is plugged into the PCMCIA port, the wirewrap pins will be positioned outside of the casing.

13. The extender card of claim 12 wherein:
the plurality of wirewrap pins are arranged according to conventional breadboard hole spacing.

14. The extender card of claim 12 further comprising:
a PCMCIA receptacle coupled to a second end of the elongated member and including a second plurality of connectors each coupled to a respective one of the plurality of conductors.

15. The extender card of claim 12 further comprising:
a ground plane coupled to the elongated member; and
a plurality of ground strips extending substantially in parallel with the plurality of conductors; wherein the plurality of ground strips and at least one of the conductors is coupled to the ground plane.

16. The extender card of claim 12 wherein:
the elongated member includes a first insulating layer, a second insulating layer, and a third insulating layer;
the plurality of conductors includes a first set of conductors coupled to a first side of the first insulating layer;
the extender card further includes a ground plane coupled to a second side of the first insulating layer and to first side of the second insulating layer;
the extender card further includes a power plane coupled to a second side of the second insulating layer and to a first side of the third insulating layer; and
the plurality of conductors further includes a second set of conductors coupled to a second side of the third insulating layer.

17. The extender card of claim 16 wherein:
the insulating layers of the elongated member extend around edges of the ground plane and the power plane to insulatively encapsulate the ground plane and the power plane.

18. An apparatus suitable for use with a personal computing system having a casing and a port disposed within the casing, the port being accessible through an opening in the casing and being spaced apart from the opening sufficiently to be capable of receiving a logic board therebetween, the apparatus comprising:
an extender card;
a first bus connector coupled to a first end of the extender card for engaging the port of the personal computing system, the first bus connector and the first end of the extender card being sized to fit within the casing opening associated with the port of the personal computing system;
a second bus connector coupled to a second end of the extender card;
a plurality of wirewrap pins coupled to the extender card substantially near the second end; and
a plurality of conductors coupled to the extender card and the electrically coupling the first and second bus connectors and the plurality of wirewrap pins;
wherein the elongated member is sufficiently long so that when the extender card is inserted into the opening in the casing with the first bus connector plugged into the port of the personal computing system, the second bus connector and the wirewrap pins will be positioned outside of the casing.

19. The apparatus of claim 18 further comprising:
a ground plane coupled to the extender card and to at least one of the plurality of conductors.

20. The apparatus of claim 19 further comprising:
a plurality of ground strips interspersed with the plurality of conductors and coupled to the ground plane.

21. A method of coupling a development board to a notebook computer having a PCMCIA receptacle and an opening providing access thereto, the method comprising the steps of:
inserting a first end of an extender card through the opening and into electrical connection with the PCMCIA receptacle;
coupling the development board to a second end of the extender card which extends out the opening from the notebook computer; and
wrapping first end of selected wires about selected pins of the development board and second ends of the selected wires about selected pins of the extender card, to couple bus conductors of a circuit on the development board to a PCMCIA bus of the notebook computer via conductors of the extender card.

22. An extender card suitable for use with a personal computing system having a casing and a port disposed within the casing, the extender card comprising:
a generally elongated member;
a header coupled to a first end of the elongated member for engaging the port of the personal computing system, the header including a plurality of connectors;
a plurality of conductors electrically coupled to respective ones of the connectors; and
a plurality of wirewrap pins coupled to the elongated member and electrically coupled to respective ones of the plurality of conductors; and
wherein the elongated member is sufficiently long so that when the extender card is plugged into the port, the wirewrap pins will be positioned outside of the casing.

23. An extender card suitable for use with a personal computing system having a casing and a PCMCIA port disposed within the casing, the PCMCIA port being accessible through an opening in the casing and being spaced apart from the opening sufficiently to be capable of receiving a PCMCIA logic board therebetween, the extender card providing a development environment for peripheral devices to be connected to a PCMCIA port, the extender card comprising:

a generally elongated member having a plurality of small diameter holes passing therethrough;

a PCMCIA header coupled to a first end of the elongated member for engaging the PCMCIA port of the personal computing system, the PCMCIA header and the first end of the elongated member being sized to fit through the casing opening associated with the PCMCIA port of the personal computing system;

a PCMCIA receptacle coupled to a second end of the elongated member;

a plurality of conductors electrically coupling the PCMCIA header to the PCMCIA receptacle; and a plurality of pins coupled to the elongated member such that each pin passes through an associated one of said small diameter holes, each pin being connected to an associate one of the conductors and extending transversely from the plane of the elongated member, each pin also configured to serve as a connector for external electrical components.

wherein the elongated member is sufficiently long so that when the extender card is plugged into the PCMCIA port, the pins will be positioned outside of the casing for connection to external electrical conductors.

* * * * *